United States Patent
Wu et al.

(10) Patent No.: US 7,196,938 B1
(45) Date of Patent: Mar. 27, 2007

(54) CHARGE-SHARING TECHNIQUE DURING FLASH MEMORY PROGRAMMING

(75) Inventors: Yonggang Wu, Santa Clara, CA (US);
Guowei Wang, Cupertino, CA (US);
Nian Yang, Mountain View, CA (US);
Aaron Lee, Mountain View, CA (US)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 11/229,530

(22) Filed: Sep. 20, 2005

(51) Int. Cl.
*G11C 16/04* (2006.01)
(52) U.S. Cl. .................... 365/185.33; 365/185.18; 365/185.25
(58) Field of Classification Search ......... 365/185.33, 365/185.18, 185.25
See application file for complete search history.

(56) References Cited

U.S. PATENT DOCUMENTS 6,570,790 B1 * 5/2003 Harari ................. 365/185.33

* cited by examiner

*Primary Examiner*—Huan Hoang
(74) *Attorney, Agent, or Firm*—Harrity Snyder LLP

(57) ABSTRACT

A non-volatile memory cell array, such as a Flash NOR array, is programmed by applying voltages to bit lines that connect to memory cells in the memory cell array. A first bit line corresponding to a first memory cell in the memory array may be turned on to perform a first programming operation for the first memory cell and second bit line corresponding to a second memory cell in the memory array may be turned on to perform a second programming operation that is configured to complete after the first programming operation. The turning on/off of the first and second bit lines may be overlapped to share charge between the first and second bit lines. This overlapping can reduce wasted power and decrease programming pulse overshoot problems.

20 Claims, 9 Drawing Sheets

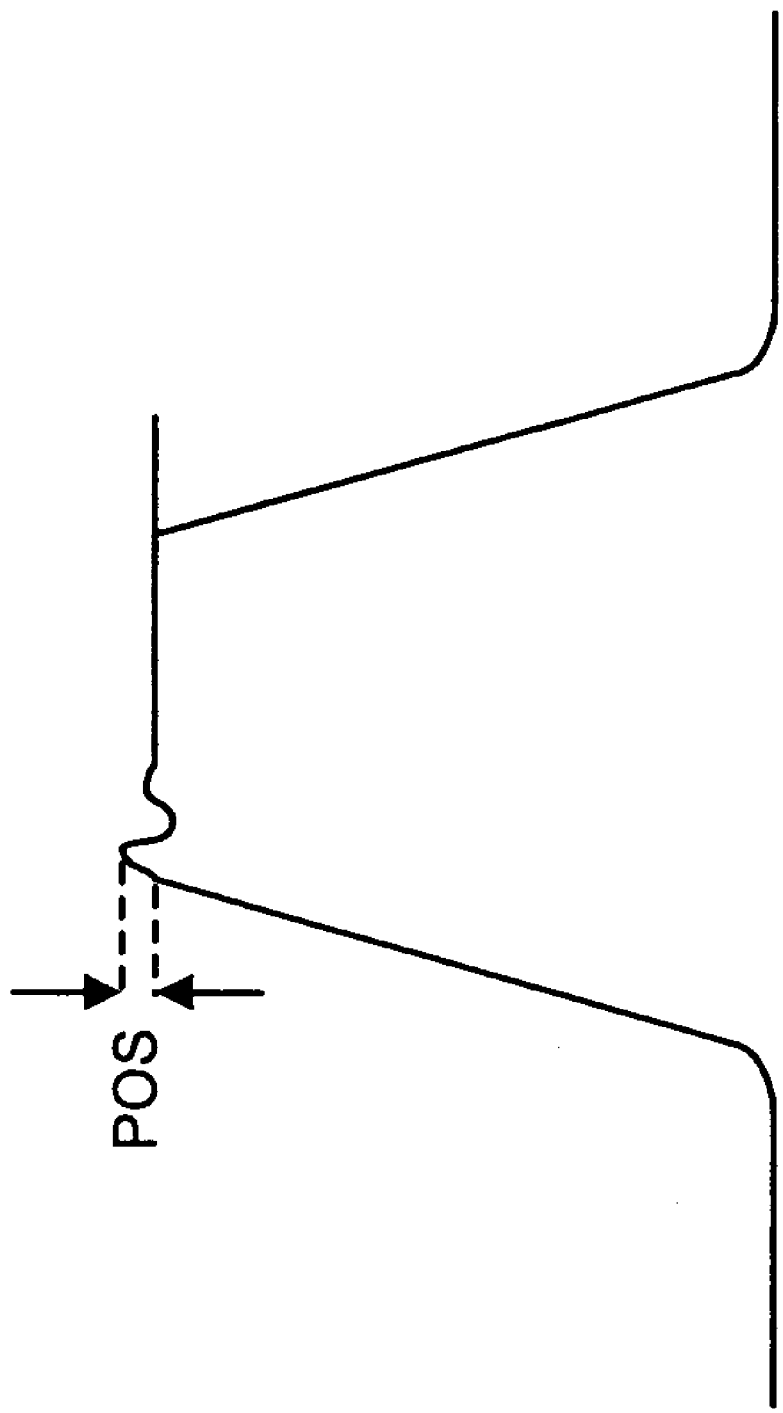

CHARGE-SHARING TECHNIQUE DURING FLASH MEMORY PROGRAMMING

TECHNICAL FIELD

The present invention relates generally to non-volatile memory devices, and more specifically, to data programming operations for non-volatile memory devices.

BACKGROUND ART

Flash memory is a common type of non-volatile semiconductor memory device. Non-volatile refers to the trait of retaining stored data when power is turned off. Because Flash memory is non-volatile, it is commonly used in power conscious applications, such as in battery powered cellular phones, personal digital assistants (PDAs), and in portable mass storage devices such as memory sticks.

Flash memory devices typically include multiple individual components formed on or within a substrate. Such devices often comprise a high density section and a low density section. For example, a Flash memory may include one or more high density core regions and a low density peripheral portion formed on a single substrate. The high density core regions typically include arrays of individually addressable, substantially identical floating-gate type memory cells. The low density peripheral portion may include input/output (I/O) circuitry, circuitry for selectively addressing the individual cells (such as decoders for connecting the source, gate and drain of selected cells to predetermined voltages or impedances to effect designated operations of the cell such as programming, reading or erasing), and voltage regulation and supply circuitry.

In one particular type of Flash memory architecture, called NOR Flash memory, memory cells within the core portion are coupled together in a circuit configuration in which each memory cell has a drain, a source, and a stacked gate. In operation, memory cells may be addressed by circuitry in the peripheral portion to perform functions such as reading, erasing, and programming of the memory cells.

When programming and erasing NOR-type Flash memory cells, multiple memory cells may be programmed at once. In a programming operation, each cell being programmed is a load to the power generation circuitry in the memory device. In such a programming architecture, it is desirable to efficiently use power by the memory cells during programming.

DISCLOSURE OF THE INVENTION

One aspect of the invention is directed to a memory device that includes at least one array of non-volatile memory cells, each of the non-volatile memory cells being associated with bit lines and a word line. The memory device further includes select switches coupled to the bit lines and that selects a second bit line for programming while continuing to select a first bit line that was previously selected for programming. The first and second bit lines, when selected, are electrically connected to each other.

Another aspect is directed to a method of programming a non-volatile memory array. The method includes activating a first bit line corresponding to a first memory cell in the memory array to perform a first programming operation for the first memory cell and activating a second bit line corresponding to a second memory cell in the memory array to perform a second programming operation that is configured to complete after the first programming operation. Charge is shared between the first bit line and the second bit line by overlapping activation of the first and second bit lines.

Yet another aspect is directed to a memory device including an array of non-volatile memory cells, each memory cell in the array including a gate area, a first terminal, and a second terminal. The memory device further includes word lines each connecting to gate areas of the non-volatile memory cells. Still further, the memory device includes bit lines, each bit line connecting to the first terminal or the second terminal of a plurality of the memory cells. The plurality of bit lines are controlled to have voltages applied to the bit lines during a program operation of the memory device such that charge from a previous program operation of the memory device on a first of the plurality of the bit lines is shared with a second of the plurality of the bit lines that is being used in a subsequent program operation of the memory device.

BRIEF DESCRIPTION OF THE DRAWINGS

Reference is made to the attached drawings, wherein elements having the same reference number designation may represent like elements throughout.

FIG. 9 is a diagram illustrating pulse overshoot.

BEST MODE FOR CARRYING OUT THE INVENTION

Techniques described below relate to a Flash memory programming technique in which programming windows are overlapped to thereby take advantage of charge stored from a previous programming window. Advantageously, power loss can be reduced.

Memory Device Overview

Figure 1:
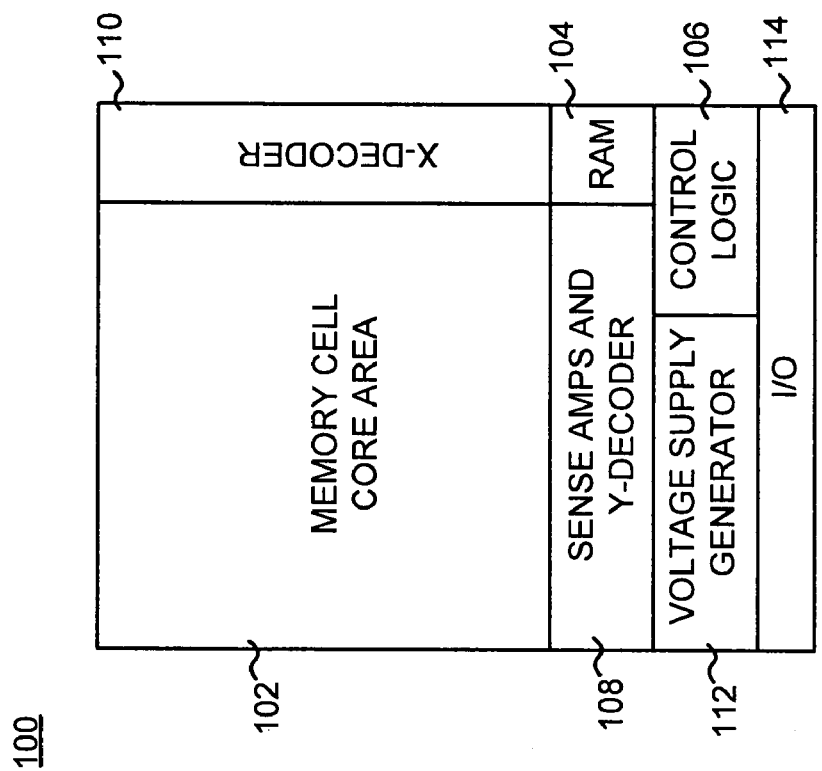
FIG. 1 is a block diagram illustrating an exemplary high-level implementation of a memory device.

FIG. 1 is a block diagram illustrating an exemplary high-level implementation of a memory device 100. Memory device 100 may be a Flash memory device implemented as an integrated circuit.

As shown in FIG. 1, memory device 100 includes a core area 102. Core area 102 may include arrays of high density memory cells, such as, for example, SONOS-type (silicon-oxide-nitride-oxide-silicon) NOR memory cells, where the nitride layer acts as the charge storage element. More specifically, core area 102 may include multiple M×N memory arrays of substantially identical memory cells.

The memory cells in area 102 may be implemented such that each memory cell can store two or more bits. In one such multi-bit per memory cell technology, called Mirror- Bit™, the intrinsic density of a Flash memory array can be doubled by storing two physically distinct charges on opposite sides of a memory cell. Each charge, representing a bit within a cell, serves as a binary unit of data (e.g. either "1" or "0"). Reading or programming one side of a memory cell occurs independently of the data that is stored on the opposite side of the cell.

Although shown as a single block in FIG. 1, core area 102 may be implemented as a number of memory cell arrays. Each such memory cell array may be associated with X-decoder 110 and Y-decoder 108. X-decoder 110 and Y-decoder 108 may decode address information, such as addresses received by memory device 100 that define a specific byte or word (or groups of bytes or words) that are to be written to or read from. The decoded addresses specify the appropriate physical lines in the memory cell array(s) that are to be used.

Y-decoder 108 may also include appropriate sense amplifier circuitry. Sense amplifiers may be used to sense the programmed or non-programmed state of the memory cells in core area 102.

Random access memory (RAM) 104 may include memory, such as static dynamic random access memory (SRAM) or dynamic random access memory (DRAM) type memory, that can serve as a memory cache between core area 102 and I/O lines 114. Relative to the memory cells in core area 102, RAM 104 may be a higher speed memory and may be a volatile memory (i.e., loses its data when powered down). I/O buffers 114 may provide buffering to facilitate data transfer between RAM 104 and memory device 100 and/or between core area 102 and RAM 104.

Voltage supply generator 112 may act as a power supply for the programming, reading, and erase functions performed on the memory cells in core area 102. Programming and erasing the memory cells, in particular, may require supply voltages larger than those supplied to memory device 100. For example, memory device 100 may be powered from a 3.5 volt source while a program operation may require a nine volt source. Voltage supply generator 112 may use one or more charge pumps to generate these higher voltages.

Control logic 106 may generally control X-decoder 110, Y-decoder 108, RAM 104, voltage supply generator 112, and I/O lines 114 to control the read, programming, and erasing of memory cell core area 102. Control logic 106 may include a state machine that appropriately manipulates memory cell core area 102 based on input address, data, and control signals received by memory device 100 through I/O lines 114.

Figure 2:
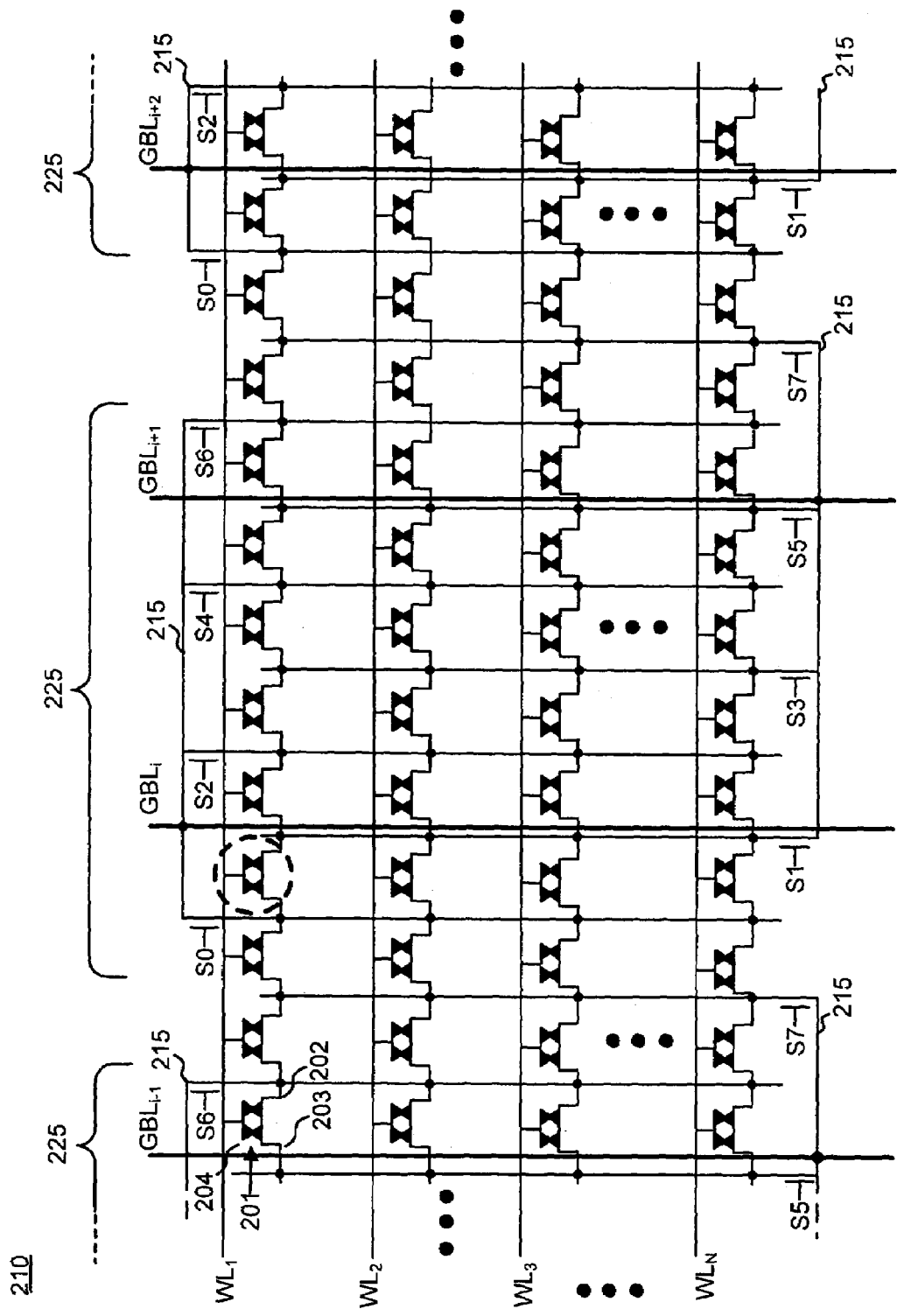
FIG. 2 is a diagram illustrating an exemplary portion of an array of memory cells implemented in the core area shown in FIG. 1.

FIG. 2 is a diagram illustrating an exemplary portion of an array of memory cells implemented in core area 102, labeled as memory array 210. The array includes a number of substantially identical memory cells 201. Each memory cell 201 includes a drain 202, a source 203, and a stacked gate region 204. Drain 202 and source 203 are interchangeable within a memory cell depending on the applied voltages and may be switched with respect to one another. The NOR configuration illustrated in FIG. 2 includes word lines (word lines $WL_1$ through $WL_N$) each connected to the gate region 204 of a number of memory cells in a row. Bit lines are arranged orthogonally to the word lines in array 210. The bit lines include global bit lines ($GBL_{i-1}$ through $GBL_{i+2}$) that each connect to one or more additional bit lines 215. Voltages placed on additional bit lines 215 via a global bit line GBL may be controlled through select transistors (also called select switches) S0 through S7.

As illustrated in FIG. 2, select transistors S0 through S7 may be arranged in repeating groups 225 of select transistors. Corresponding select transistors in a number of groups may be controlled by the same control signal. For example, activating select transistor S0 may connect the particular bit line connected to S0 to voltages applied to $GBL_i$, $GBL_{i+2}$, etc. If select transistor S1 was also activated, $GBL_{i+1}$, $GBL_{i+3}$, etc., would also be connected to the opposing source/drain of a number of memory cells in memory array 210. By also activating a word line WL, one memory cell in each group 225 may have its source, drain, and gate terminals all activated, thus allowing programming or reading of this select memory cell 201. As an example of selecting a particular memory cell 201 within a group 225 (e.g., the memory cell within the dotted circle in FIG. 2), assume that a voltage is placed on $WL_1$ and that S0 and S1 are turned-on and that voltages are placed on $GBL_i$ and $GBL_{i+1}$. At this point, this cell has voltages applied to its gate, source, and drain and may be programmed or read. Other memory cells 201 in other groups 225 can be simultaneously selected based on activation of the same WL and select transistors.

Although the memory cells 201 in core area 102 are shown as NOR memory cells, in some implementations, the circuitry in the peripheral regions of memory device 100 may provide an external interface that mimics an external interface normally provided by NAND-type Flash memories. In this situation, memory device 100, from the point of view of the user/circuit designer, can effectively be thought of as a NAND-type Flash device even though core area 102 includes NOR-type Flash memory.

Although only four bit lines and four word lines are shown in FIG. 2, one of ordinary skill in the art will recognize that a typical memory cell architecture will include many more cells in an array. For instance, in one implementation, core array 102 may include multiple memory cell arrays, each including 2048 bit lines and 256 word lines. The 2048 bit lines correspond to 256 eight memory cell groups 225 of select transistors.

Figure 3:
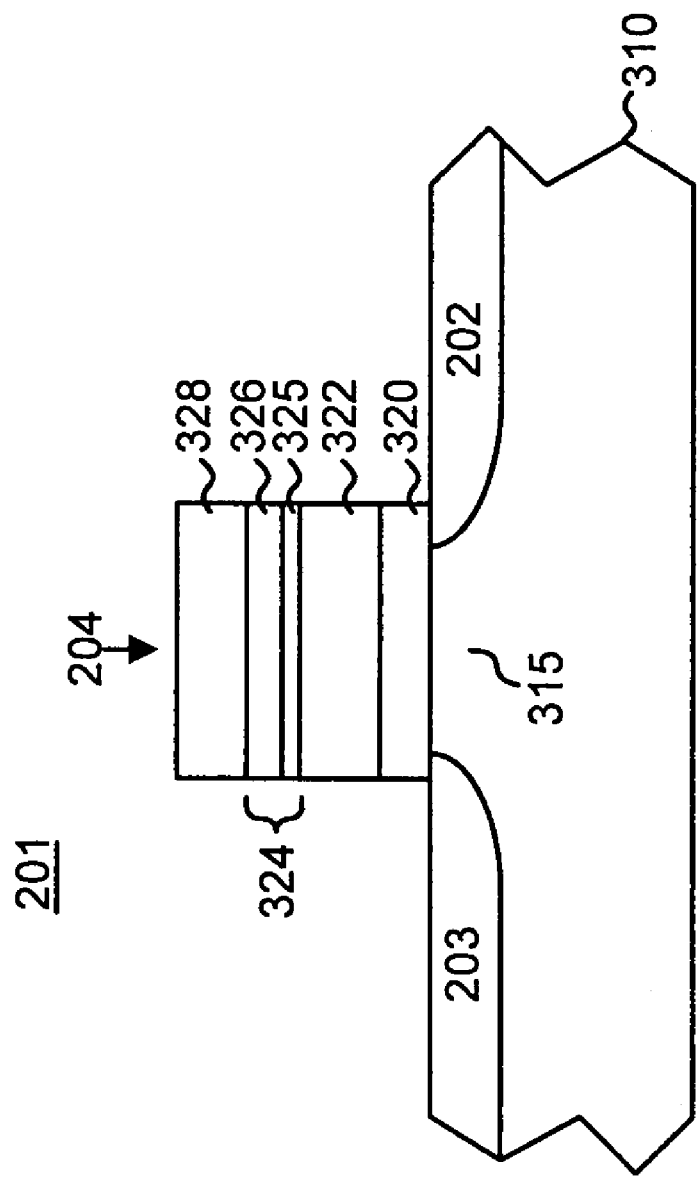
FIGS. 3 and 4 are diagrams illustrating a cross-section of an exemplary one of the memory cells shown in FIG. 2.

FIG. 3 is a diagram illustrating a cross-section of an exemplary one of memory cells 201 in more detail. Memory cell 201 may be formed on a substrate 310 and includes drain 202, source 203, and stacked gate 204. Substrate 310 may be formed of a semiconducting material such as silicon, germanium, or silicon-germanium. Drain and source regions 202 and 203 may be regions that are doped with n-type impurities, such as phosphorous or arsenic, or p-type impurities, such as boron. As previously mentioned, depending on the applied voltage values, the functions of drain and source regions 202 and 203 may be reversed.

As shown in FIG. 3, stacked gate 204 is formed on channel region 315. Stacked gate 204 includes a number of layers, including a relatively thin gate dielectric layer 320, a charge storage layer 322, a second dielectric layer 324, and a control gate 328. Dielectric layer 320 may include an oxide, such as a silicon oxide (e.g., $SiO_2$).

Charge storage layer 322 may be formed on gate dielectric layer 320 and may include a dielectric material, such as a nitride (e.g., a silicon nitride). Layer 322 acts as a charge storage layer for the memory cell.

Charge storage layer 322 may be used to store one or more bits of information. In an exemplary implementation, charge storage layer 322 may store charges representing two separate bits of data by localizing the first and second charges to the respective left and right sides of charge storage layer 322. Each of the two charges of the memory cell 201 may be programmed independently by, for example, channel hot electron injection, to store a charge on each respective side of the charge storage layer 322. In this manner, the charges in charge storage layer 322 become effectively trapped on each respective side of charge storage layer 322 and the density of the resulting memory array may be increased as compared to memory devices that store only one bit of data per cell. In alternate implementations, charge storage layer 322 may store charges representing three or more bits of data for each memeory cell 201.

Second dielectric layer 324 may be formed on layer 322 and may include a multi-layer structure, such as a first silicon oxide layer 325 and a second high dielectric constant (high-K) layer 326. High-K layer 326 may include, for example, an alumina, such as $Al_2O_3$. Dielectric layers 325 and 326 may together function as an inter-gate dielectric for memory cells 201. In alternate implementations, dielectric layer 324 may include a single layer, such as a silicon oxide or alumina.

Control gate 328 may be formed above second dielectric layer 324. Control gate 328 may be formed of, for example, polysilicon and may be connected to the word line of memory cell 201.

In operation, core area 102 of memory device 100 may be programmed by a channel hot electron injection process that injects electrons into charge storage layer 322. The injected electrons become trapped in charge storage layer 322 until an erase operation is performed.

In operation, memory cells 201 in core array 102 may be programmed by applying a relatively high voltage (e.g., 9 volts) to one of the word lines WL, such as $WL_1$, which effectively applies the voltage to control gates 328 of the memory cells that are coupled to $WL_1$. Simultaneously, a voltage may be applied across drain 202 and source 203 of one of the memory cells in a group 225. For example, approximately five volts may be applied to $GBL_i$ and $GBL_{i+1}$ may be grounded. Also, select transistors S0 and S1 may be turned on by applying an appropriate voltage to S1. These voltages generate a vertical and lateral electric field in the activated memory cell(s) (e.g., the circled memory cell in FIG. 2) along the length of the channel from the source to the drain. These electric fields causes electrons to be drawn off the source and begin accelerating toward the drain. As they move along the length of the channel, they gain energy. If they gain enough energy, they can jump over the potential barrier of the dielectric layer 320 into one side of charge storage layer 322 and become trapped. The trapped electrons change the electrical properties of the memory cell. In a read operation, the source and drain terminals are interchanged. For example, the corresponding read operation may be performed by applying approximately three volts to $WL_1$, grounding $GBL_i$, and applying approximately 1.5 volts to $GBL_{i+1}$.

Figure 4:
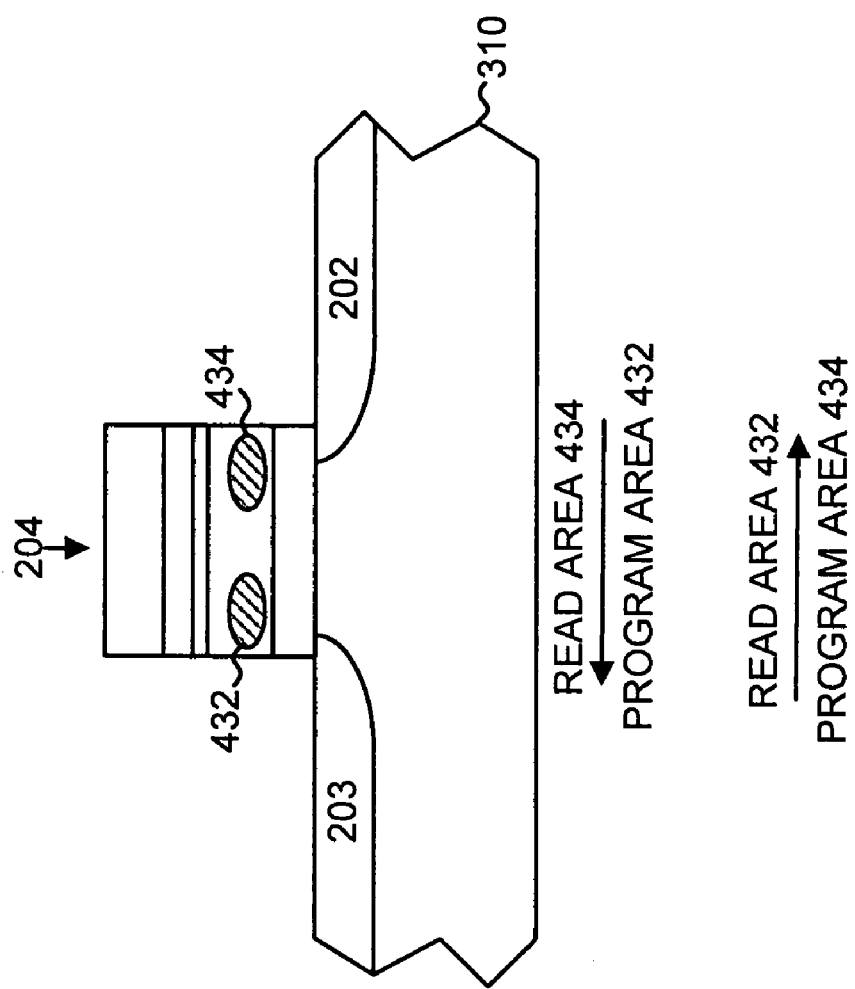

When two bits are stored in charge storage layer 322, the second bit is programmed in a manner similar to the first bit, except that the source and drain terminals are reversed in both directions. FIG. 4 is a diagram illustrating a cross-section of the exemplary memory cell shown in FIG. 3. Additionally, FIG. 4 illustrates read and program directions for when memory cell 201 is used to store charges representing two independent bits. Memory cell 201 includes two separate charge storage areas 432 and 434 within charge storage layer 322. Each storage area 432 and 434 may define one bit. To program the left area 432 or read the right area 434, area 203 acts as the drain and receives a high voltage relative to area 202, which acts as the source. To program the right area 434 or read the left area 432, area 202 acts as the drain and receives a high voltage relative to area 203, which acts as the source. The arrows in FIG. 4 graphically illustrate the direction of charge flow.

Memory Device Programming

As previously mentioned, multiple memory cells 201 in a row (i.e., the memory cells 201 having a common word line) can be simultaneously programmed by activating a word line and pairs of select transistors S0 through S7 in different groups 225. Simultaneously programming multiple memory cells 201 can be conceptually thought of as programming multiple memory cells within a "program window." In the exemplary implementation described herein, the program window size will be described as being 256 bits wide. That is, programming is performed in 256-bit chunks. One of ordinary skill in the art will recognize that other program window sizes could be used.

Figure 5:
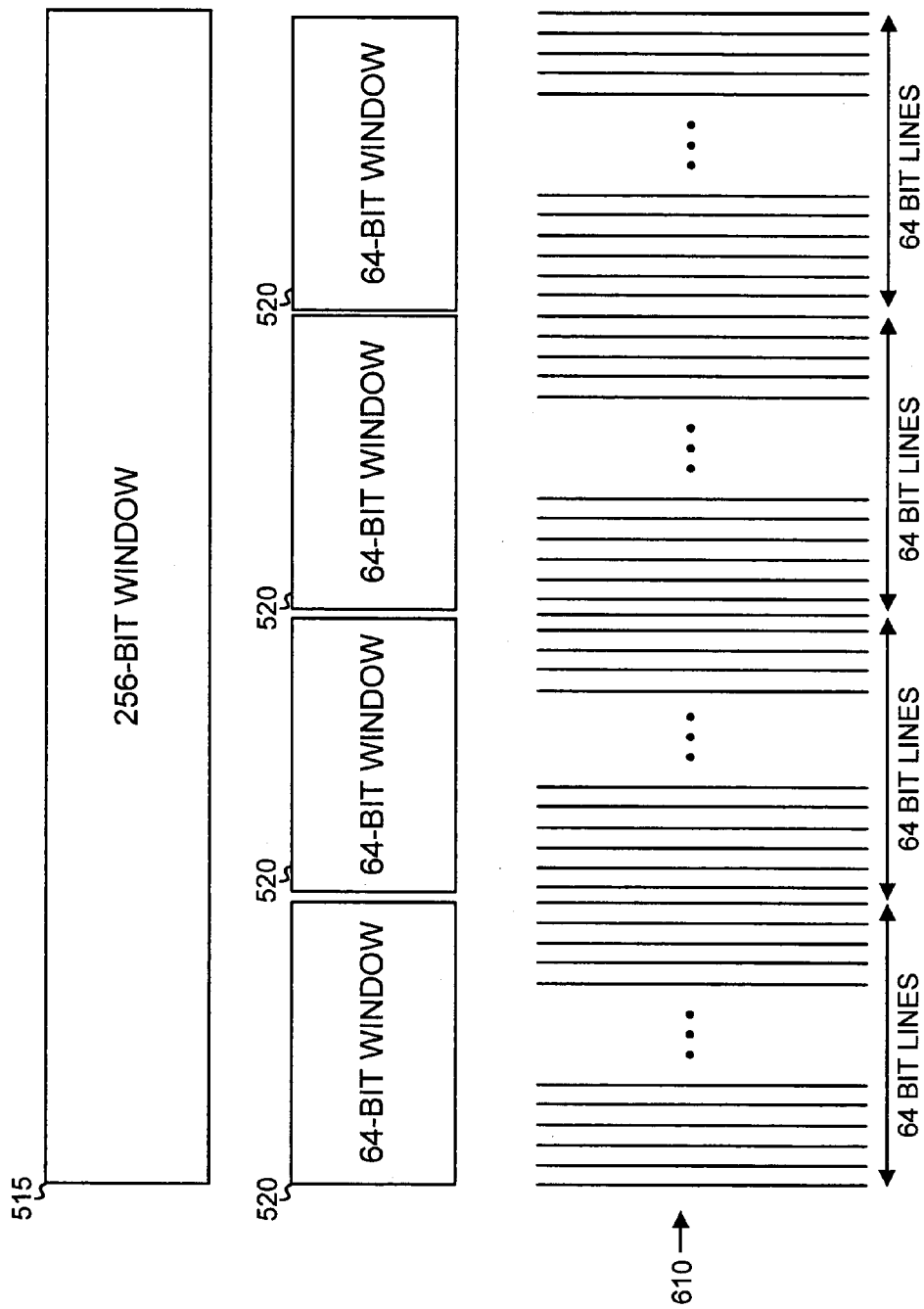
FIG. 5 is a diagram illustrating the concept of a programming window.

A programming window 515 is illustrated in FIG. 5. Programming window 515 may include the 256 bits that are to be written to core area 102. Based on each of the bits in programming window 515, memory device 100 may determine whether the physical memory cell 201 that corresponds to the bit needs to be programmed. Programming window 515 may be further subdivided into sub-windows 520, such as by subdividing the 256 bits in programming window 520 into four 64-bit windows. The four 64-bit windows 520 may then be simultaneously or sequentially programmed to core area 102. Each bit line that is to be programmed may draw a fixed programming current from voltage supply generator 112. In one implementation, to further decrease the load on voltage supply generator 112, sub-windows 520, instead of all being programmed simultaneously, may be programmed sequentially relative to one another.

Memory programming will be further described herein as being based on a 64-bit sub-window 520. One or ordinary skill in the art will recognize that other programming sub-window sizes could be used. Also, the concept of having a programming widow including sub-windows may alternatively be implemented as a single programming window without sub-windows.

Although sub-window 520 includes 64 bits, a program technique known as the inverse programming method may be used, which ensures that at most, only half of these bits (i.e., 32) will actually need to be programmed to their respective memory cells. Additionally, memory configuration bits that are not related to the substantive data may also need to be programmed with these 32 (maximum) number of bits. These configuration bits may include bits such as a spare bit, indication bit, and dynamic reference bit. In one implementation, a maximum of five configuration bits may need to be programmed for each sub-window 520, giving 37 total maximum bits for programming for each 64-bit sub-window 520.

The inverse programming method dynamically selects how to interpret a programmed cell 201 based on the data in sub-window 520. For example, if a non-programmed memory cell 201 (i.e., a cell with no stored charge) is normally interpreted as being a logical one, and sub-window 520 includes all logical zeros, instead of programming all the bits in sub-window 520 (i.e., 64 bits), the non-programmed memory cells 201 in sub-window 520 may instead be interpreted as corresponding to a logic zero. In this manner, instead of programming all 64 bits of sub-window 520, none of the bits in sub-window 520 need to be programmed. In this example, as few as one configuration bit may be programmed, such as the dynamic reference bit, to indicate that the memory cells in the sub-window are to be interpreted with non-programmed memory cells being a logic zero.

Figure 6:
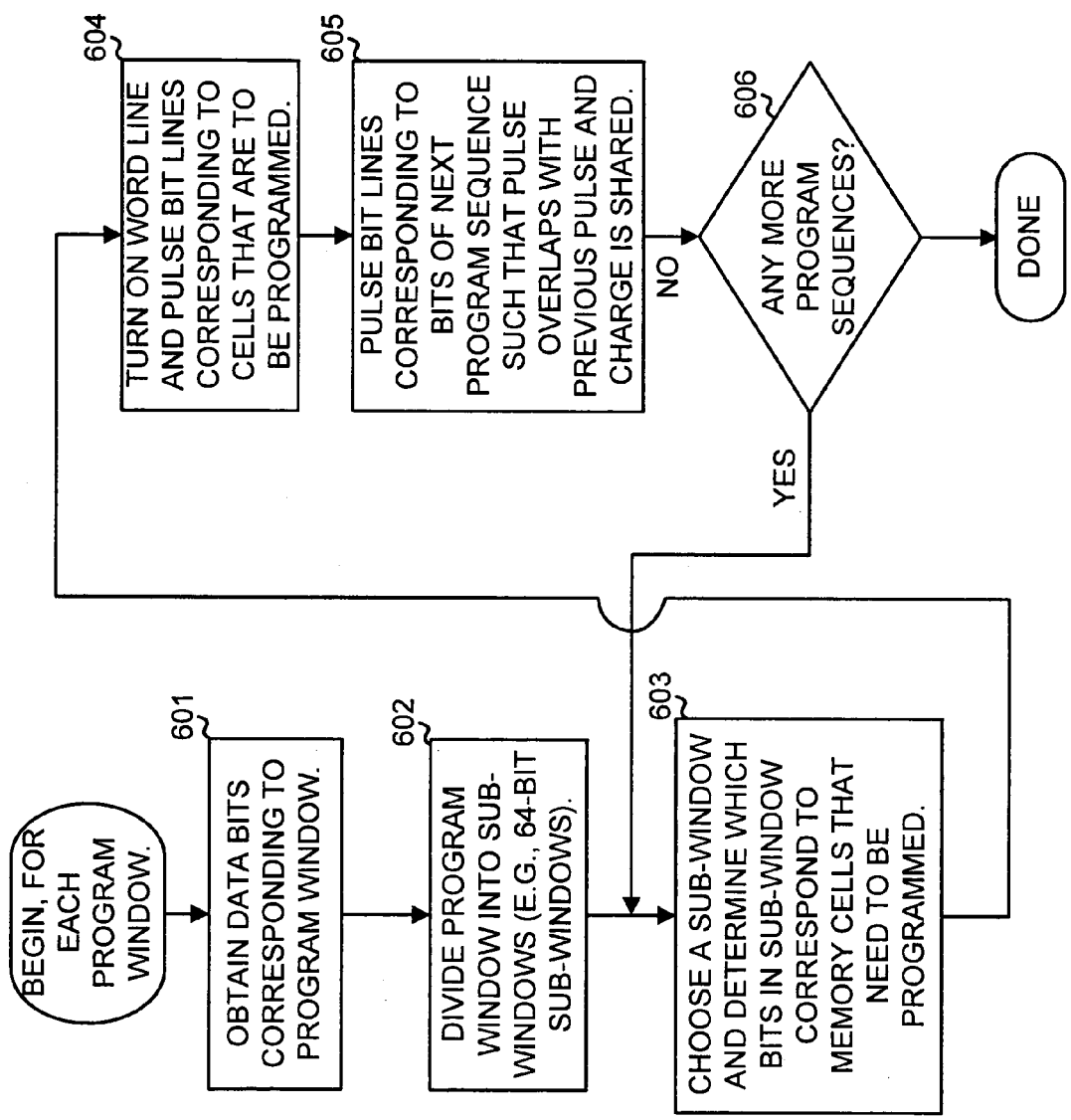
FIG. 6 is a flow chart illustrating exemplary programming of a memory device such as the memory device shown in FIG. 1.

FIG. 6 is a flow chart illustrating exemplary programming of a memory device such as memory device 100. A program window, such as program window 515, is obtained that includes the bits that are to be written to memory (act 601). As mentioned, one possible size for the program window may be a 256-bit program window. The program window may be divided into sub-windows 520, such as four 64-bit sub-windows (act 602). Data corresponding to each sub-window 520 may then be sequentially written to the memory cells. In some possible implementations, multiple sub-windows may be simultaneously written.

For a select sub-window 520 that is to be written, logic in memory device 100, such as, for example, logic in Y-decoder circuitry 108 or control logic 106, may determine which bits in the selected sub-window require programming (act 603). The inverse programming method may be used to minimize the required number of memory cells 201 that need to be programmed.

Figure 7:
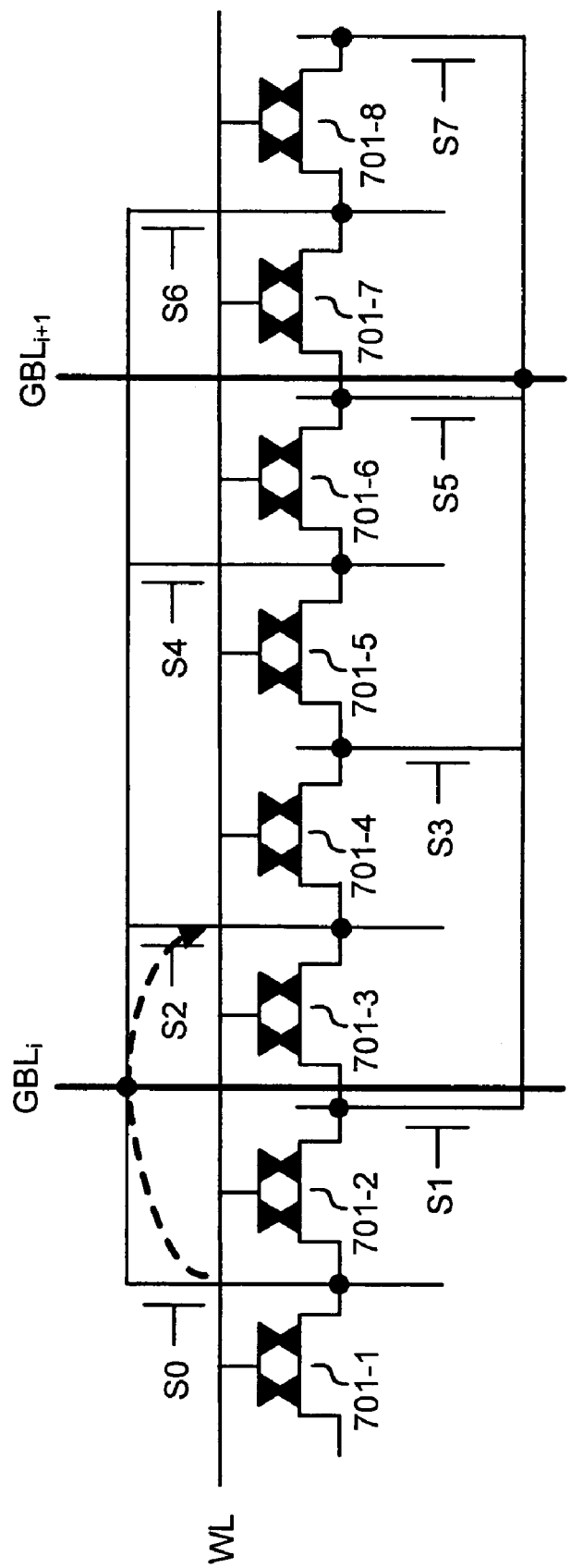
FIG. 7 is a diagram illustrating an exemplary word line and a corresponding group of memory cells.

The word line corresponding to programming window 515 may next be activated by applying a relatively high voltage, such as 9V, to the word line (act 604). Also, the bit lines corresponding to the memory cells 201 that are to be programmed may be activated by pulsing the bit lines (act 604). FIG. 7 is a diagram illustrating an exemplary word line (WL) and a group of eight memory cells 701-1 through 701-8, each having bit lines controlled by corresponding select transistors S0–S7. A 64-bit programming window 520 may correspond to one bit within each of 64 of such groups of memory cells 201. As an example, assume that the left bit in memory cell 701-2 is to be programmed. In this situation, the left side of memory cell 701-2 is the drain and the right side of the memory cell is the source. Accordingly, a voltage (e.g., about 4.5 volts) may be applied to bit line $GBL_i$, select transistor S0 may be activated, bit line $GBL_{i+1}$ may be grounded, and select transistor S1 may be activated. The voltages applied to WL, $GBL_i$, and $GBL_{i+1}$ may be generated by voltage supply generator 112.

Figure 8:
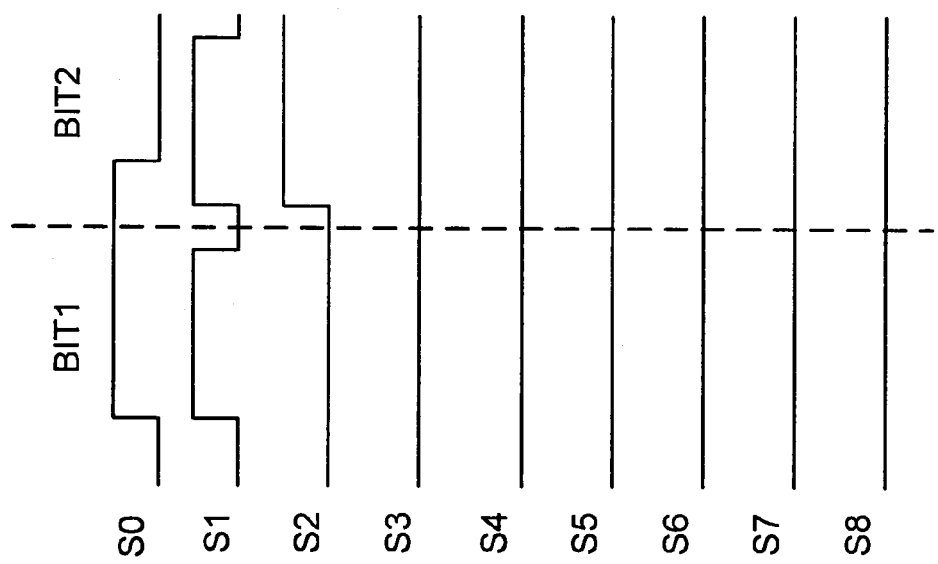
FIG. 8 is an exemplary timing diagram illustrating bit line programming pulses.

When turning on the bit lines, the bit lines may be turned on for a relatively short time via one or more pulses applied to the gates of select transistors S0–S7. FIG. 8 illustrates an exemplary application of bit line pulses to select transistors S0 through S7. The bit line pulses correspond to programming of the left bit in memory cell 701-2 in a first program sequence ("bit1") and programming of the right bit in memory cell 701-3 in a second programming sequence ("bit2").

As previously mentioned, half or less of the 64 bits of 64-bit programming window 520 may actually need to be programmed. The select transistors S0–S7 for the non-programmed groups may remain in the "off" state (i.e., non-activated). That is, no voltage may be applied to the gates of the select transistors S0–S7 for each of the non-programmed groups.

The bit lines in a next program sequence (e.g., bit2 in FIG. 8) may next be pulsed such that, when possible, the bit lines overlap one another such that charge is shared between a bit line corresponding to a previously programmed memory cell and a bit line corresponding to a memory cell that is currently being programmed (act 605). As an example of this pulse overlap, assume that memory cell 701-3 is to be programmed in the next sub-window. This memory cell may be configured such that the right bit in memory cell 701-3 is to be programmed. Accordingly, select transistor S2 corresponds to the drain bit line (e.g., a programming voltage such as 4.5 volts is applied on this bit line) and select transistor S1 corresponds to the source bit line (e.g., this bit line may be grounded). As shown in FIG. 8, select transistor S2 may be turned on slightly before select transistor S0 is turned off. This overlapping of "on" states of S2 and S0 creates an electrical connection between these two bit lines, which allows charge from the bit line corresponding to select transistor S0 to be shared with the bit line corresponding to select transistor S2. This charge sharing is illustrated graphically in FIG. 7 by the dashed arrow between the two bit lines.

In one implementation, the overlap between turning on and turning off select transistors S0 through S7, such as select transistor S0 and S2 during programming of bit2 in FIG. 8, may last for between approximately 10 ns and 15 ns. A complete programming pulse may be applied for approximately 250 ns.

Acts 603–605 may be repeated for the other sub-windows in programming window 515 (act 606). When possible, the bits to be programmed may be arranged such that charge sharing by overlapping turning on and off of the select transistors is allowed to occur.

Overlapping charge shared on bit lines can provide a number of advantages. For example, each bit line may be associated with capacitive loading, such as about 4 pico-Farad of loading. By overlapping programming of bits lines, the charge stored in the bit line will be shared with the next bit line that is to be programmed. Consequently, power can be saved and programming speed increased.

Another advantage of overlapping applied to bit lines is a potential reduction in pulse window overshoot. For fast and reliable programming, programming pulse overshoot should be minimized. FIG. 9 is a diagram illustrating pulse overshoot for an exemplary pulse. The pulse overshoot, POS, can be defined as the difference between peak amplitude of the pulse occurring over the desired steady-state pulse level. Pulse overshoot can be most severe when switching from a programming sub-window that includes many bits to be programmed (e.g., 32) to a programming sub-window that includes few bits to be programmed (e.g., 1). In this situation, because each bit line requires a constant current supply, voltage supply generator 112 will experience a large current drain followed by a small current drain. This tends to cause pulse overshoot for the bit line(s) in the second programming sub-window 520. Overlapping of pulses applied to the bit lines, as described above, can reduce pulse overshoot by stabilizing power supplied from supply generator 112 by providing for a more gradual change in load on the power supply.

CONCLUSION

As described above, programming pulses in a non-volatile memory cell array are overlapped to thereby share charge between memory cell programming lines. This overlapping can reduce power consumption and decrease programming pulse overshoot problems.

The foregoing description of exemplary embodiments of the invention provides illustration and description, but is not intended to be exhaustive or to limit the invention to the precise form disclosed. Modifications and variations are possible in light of the above teachings or may be acquired from practice of the invention.

Moreover, while series of acts have been described with regard to FIG. 6, the order of the acts may be varied in other implementations consistent with the invention. Moreover, non-dependent acts may be implemented in parallel.

No element, act, or instruction used in the description of the invention should be construed as critical or essential to the invention unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

What is claimed is:

1. A memory device comprising:
   at least one array of non-volatile memory cells, each of the non-volatile memory cells being associated with bit lines and a word line; and
   a plurality of select switches coupled to the bit lines and configured to select a second bit line for programming while continuing to select a first bit line that was previously selected for programming, the first and second bit lines, when selected, being electrically connected to each other.

2. The memory device of claim 1, wherein the select switches are arranged in groups, each group corresponding to a predetermined number of bit lines.

3. The memory device of claim 1, wherein selecting the second bit line for programming while continuing to select the first bit line is performed for between approximately 10 ns and 15 ns.

4. The memory device of claim 1, further comprising:
   control logic configured to select the second bit line for programming while continuing to select the first bit line so that charge present in the first bit line is allowed to be shared with the second bit line.

5. The memory device of claim 4, wherein sharing charge between the first and second bit lines reduces programming pulse overshoot in the memory device.

6. The memory device of claim 1, further comprising:
   a voltage supply generator for supplying power to the word line and the bit lines.

7. The memory device of claim 1, further comprising:
   control logic configured to control operation of the plurality of select switches.

8. The memory device of claim 1, wherein each of the non-volatile memory cells includes:
   a dielectric charge storage element configured to store two independent charges.

9. The memory device of claim 1, wherein each of the bit lines corresponds to approximately 4 pico-Farad of loading.

10. A method of programming a non-volatile memory array comprising:
    activating a first bit line corresponding to a first memory cell in the memory array to perform a first programming operation for the first memory cell;
    activating a second bit line corresponding to a second memory cell in the memory array to perform a second programming operation, wherein the first programming operation completes before the second programming operation completes; and
    sharing charge between the first bit line and the second bit line by overlapping activation of the first and second bit lines.

11. The method of claim 10, wherein activating the first bit line corresponding to the first memory cell further includes activating a pair of first bit lines corresponding to the first memory cell and wherein activating the second bit line corresponding to the second memory cell further includes activating a pair of second bit lines corresponding to the second memory cell.

12. The method of claim 10, further comprising:
    applying a voltage to a word line associated with the first and second memory cells.

13. The method of claim 10, further comprising:
    receiving a program window containing a predetermined number of bits that are to be written to the memory array; and
    determining which of the predetermined number of bits are to be programmed in the memory array.

14. The method of claim 10, wherein the first and second memory cells are each configured to store two bits of information.

15. The method of claim 10, wherein the overlapping activation of the first and second bit lines includes overlapping the first and second bit lines for between approximately 10 ns and 15 ns.

16. A memory device comprising:
    an array of non-volatile memory cells, each memory cell in the array including a gate area, a first terminal, and a second terminal;
    a plurality of word lines each connecting to a plurality of gate areas of the non-volatile memory cells;
    a plurality of bit lines, each bit line connecting to the first terminal or the second terminal of a plurality of the memory cells, wherein the plurality of bit lines are controlled to have voltages applied to the bit lines during a program operation of the memory device such that charge from a previous program operation of the memory device on a first of the plurality of the bit lines is shared with a second of the plurality of the bit lines that is being used in a subsequent program operation of the memory device.

17. The memory device of claim 16, wherein the memory cells are SONOS (silicon-oxide-nitride-oxide-silicon) type NOR memory cells.

18. The memory device of claim 16, further comprising:
    a plurality of select transistors configured to control application of voltage to the bit lines.

19. The memory device of claim 16, whereby the sharing of charge on the first of the plurality of bit lines and the second of the plurality of bit lines reduces programming pulse overshoot in the bit lines.

20. The memory device of claim 16, wherein each of the memory cells are each configured to store two bits of information.

* * * * *